US012568614B2

(12) United States Patent
Kim

(10) Patent No.: US 12,568,614 B2
(45) Date of Patent: Mar. 3, 2026

(54) METHOD OF FABRICATING SEMICONDUCTOR DEVICE

(71) Applicant: SAMSUNG ELECTRONICS CO., LTD., Suwon-si (KR)

(72) Inventor: Eunjung Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 363 days.

(21) Appl. No.: 18/213,310

(22) Filed: Jun. 23, 2023

(65) Prior Publication Data

US 2023/0422470 A1     Dec. 28, 2023

(30) Foreign Application Priority Data

Jun. 24, 2022    (KR) ........................ 10-2022-0077670

(51) Int. Cl.
*H10B 12/00*          (2023.01)

(52) U.S. Cl.
CPC ......... *H10B 12/053* (2023.02); *H10B 12/315* (2023.02); *H10B 12/482* (2023.02); *H10B 12/488* (2023.02)

(58) Field of Classification Search
CPC .... H10B 12/033; H10B 12/053; H10B 12/09; H10B 12/315; H10B 12/482; H10B 12/485; H10B 12/488
See application file for complete search history.

(56) References Cited

U.S. PATENT DOCUMENTS

| | | | |
|---|---|---|---|
| 7,361,569 | B2 | 4/2008 | Tran et al. |
| 8,785,325 | B2 | 7/2014 | Sudo |
| 8,795,540 | B2 | 8/2014 | Shieh et al. |
| 9,165,765 | B1 | 10/2015 | Raley et al. |
| 9,543,155 | B2 | 1/2017 | Lee et al. |
| 9,941,285 | B2 | 4/2018 | Chun et al. |
| 10,439,048 | B2 | 10/2019 | Lim et al. |
| 2011/0124196 | A1 | 5/2011 | Lee |

(Continued)

FOREIGN PATENT DOCUMENTS

KR     10-2011-0055912 A     5/2011

*Primary Examiner* — Hoai V Pham
(74) *Attorney, Agent, or Firm* — Sughrue Mion, PLLC

(57) ABSTRACT

A method of manufacturing a semiconductor device is provided. The method includes: forming a lower structure including a cell array region and an extension region, the cell array region including a first impurity region, a second impurity region and word lines extending in a first direction, and the extension region including an insulating layer; forming a preliminary bit line structure on the lower structure; forming a mask layer on the preliminary bit line structure and the lower structure; forming spacer patterns extending in a second direction, intersecting the first direction, on the mask layer; forming material layers on side surfaces of the spacer patterns, on the extension region; forming mask patterns by patterning the mask layer using the spacer patterns and the material layers as a first etching mask; and forming bit line structures by patterning the preliminary bit line structure using the mask patterns as a second etching mask. Each of the bit line structures includes a first portion formed on the cell array region and a second portion formed on the extension region, and the first portion is narrower than the second portion.

20 Claims, 21 Drawing Sheets

(56)                    References Cited

U.S. PATENT DOCUMENTS

| 2011/0300711 | A1 | 12/2011 | Martin et al. |
| 2011/0312184 | A1 | 12/2011 | Lee et al. |
| 2018/0129773 | A1 | 5/2018 | Park et al. |
| 2024/0276702 | A1* | 8/2024 | Ikeda .................. H10B 12/482 |

* cited by examiner

METHOD OF FABRICATING SEMICONDUCTOR DEVICE

CROSS-REFERENCE TO RELATED APPLICATION

This application claims priority to Korean Patent Application No. 10-2022-0077670 filed on Jun. 24, 2022 in the Korean Intellectual Property Office, the disclosure of which is incorporated herein by reference in its entirety.

BACKGROUND

The present disclosure relates to a method of manufacturing a semiconductor device, and to a semiconductor device manufactured thereby.

Research is being undertaken to reduce the size of elements constituting a semiconductor device and improve performance. For example, in a dynamic random access memory (DRAM), research is being conducted to reliably and stably form elements having reduced sizes.

SUMMARY

Example embodiments provide a method of manufacturing a semiconductor device, including a method of forming a pattern having a binary width.

According to example embodiments, a method of manufacturing a semiconductor device includes: forming a lower structure including a cell array region and an extension region, the cell array region including a first impurity region, a second impurity region and word lines extending in a first direction, and the extension region including an insulating layer; forming a preliminary bit line structure on the lower structure; forming a mask layer on the preliminary bit line structure and the lower structure; forming spacer patterns extending in a second direction, intersecting the first direction, on the mask layer; forming material layers on side surfaces of the spacer patterns, on the extension region; forming mask patterns by patterning the mask layer using the spacer patterns and the material layers as a first etching mask; and forming bit line structures by patterning the preliminary bit line structure using the mask patterns as a second etching mask. Each of the bit line structures includes a first portion formed on the cell array region and a second portion formed on the extension region, and the first portion is narrower than the second portion.

According to example embodiments, a method of manufacturing a semiconductor device includes: forming a lower structure including a cell array region and an extension region; forming a preliminary bit line structure on the lower structure; forming a spacer structure that extends in an extension direction from the cell array region to the extension region, on the preliminary bit line structure, the spacer structure having a symmetrical shape with respect to the extension direction, and the spacer structure being wider in the cell array region than in the extension region; and forming a bit line structure by patterning the preliminary bit line structure using the spacer structure as an etching mask.

According to example embodiments, a method of manufacturing a semiconductor device includes: forming a lower structure including a cell array region and an extension region; forming a preliminary bit line structure on the lower structure; forming spacer patterns extending in a direction from the cell array region to extension region, on the preliminary bit line structure; sequentially forming a first spacer layer and a second spacer layer on side surfaces of the spacer patterns, in the cell array region and the extension region; selectively removing the second spacer layer in the cell array region; forming bit line structures by patterning the preliminary bit line structure using the spacer patterns, the first spacer layer, and the second spacer layer as an etching mask; and removing the spacer patterns, the first spacer layer, and the second spacer layer. Each of the bit line structures includes a first portion the cell array region that is narrower than a second portion in the extension region.

According to example embodiments, a semiconductor device includes: a substrate comprising a cell array region and an extension region; a plurality of word lines provided on the substrate and extending over the cell array region in a first direction; and a plurality of bit lines provided on the substrate and extending from the cell array region to the extension region in a second direction that crosses the first direction. Each of the plurality of bit lines is wider, along the first direction, in the extension region than in the cell array region.

BRIEF DESCRIPTION OF DRAWINGS

The above and other aspects and features of the present disclosure will be more clearly understood from the following description of example embodiments, taken in conjunction with the accompanying drawings, in which.

DETAILED DESCRIPTION

Hereinafter, example embodiments will be described with reference to the accompanying drawings. Embodiments described herein are provided as examples, and thus, the present disclosure is not limited thereto, and may be realized in various other forms. Each example embodiment provided in the following description is not excluded from being associated with one or more features of another example or another example embodiment also provided herein or not provided herein but consistent with the present disclosure. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Figure 1:
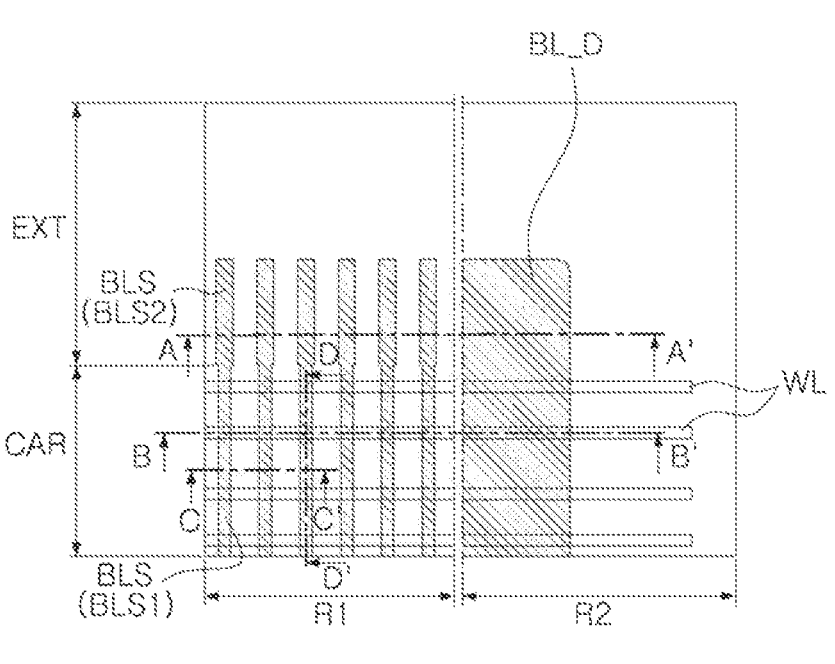
FIG. 1 is a schematic layout illustrating a semiconductor device according to example embodiments.
Figure 1:

FIG. 1 is a schematic layout diagram illustrating a semiconductor device according to example embodiments.

Figure 2:
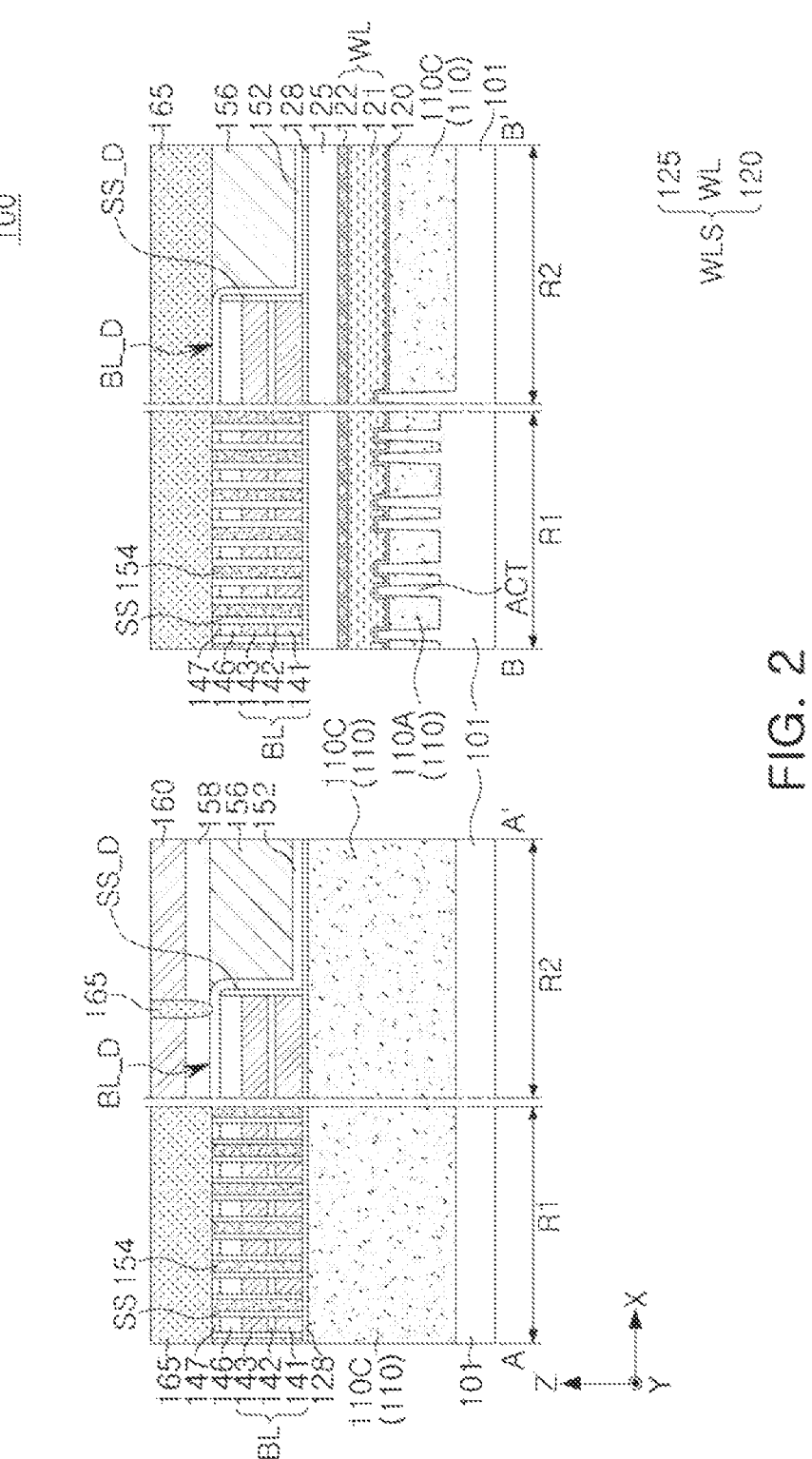
FIG. 2 is a cross-sectional view illustrating a semiconductor device according to example embodiments.
Figure 3:
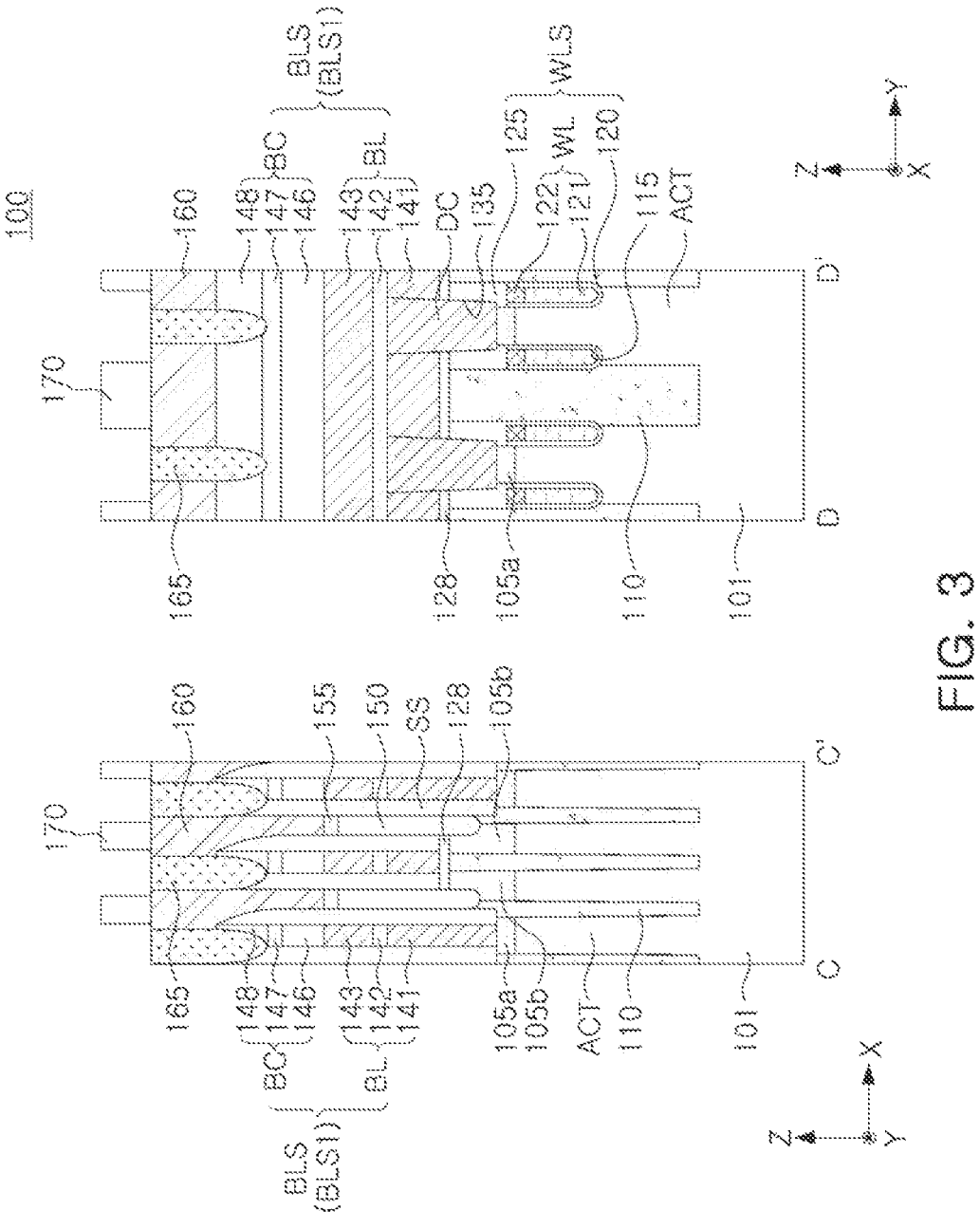
FIG. 3 is a cross-sectional view illustrating a semiconductor device according to example embodiments.

FIGS. 2 and 3 are cross-sectional views illustrating semiconductor devices according to example embodiments. FIG. 2 illustrates cross-sections of the semiconductor device of FIG. 1 taken along cutting lines A-A' and B-B', and FIG. 3 illustrates cross-sections of the semiconductor device of FIG. 1 taken along cutting lines C-C' and D-D'.

For convenience of explanation, only some components of the semiconductor device are illustrated in FIGS. 1 to 3.

Referring to FIGS. 1 to 3, the semiconductor device 100 may include a first region R1 and a second region R2. The first region R1 and the second region R2 may be defined in the substrate 101. The first region R1 may include a cell array region CAR in which memory cells are disposed, and an extension region EXT including an insulating layer. The second region R2 may be disposed around the first region R1. A word line driver, a sense amplifier, row and column decoders, and control circuits may be disposed in the second area R2.

Referring to FIGS. 1 to 3, the semiconductor device 100 may include a substrate 101 including active regions ACT, a device isolation region 110 defining active regions ACT in the substrate 101, a word line structure (WLS) embedded in the substrate 101 and extending and including a word line (WL), and bit line structures BLS extending to cross the word line structure WLS on the substrate 101 and including the bit line BL. The active regions ACT, the word line structures WLS, and the bit line structures BLS may be disposed in the first region R1. The semiconductor device 100 may further include a lower conductive pattern 150 on the active region ACT and an upper conductive pattern 160 on the lower conductive pattern 150. The semiconductor device 100 may further include a data storage structure 170 on the upper conductive pattern 160. For example, the data storage structure 170 may be a memory cell capacitor of a DRAM.

The semiconductor device 100 may further include a dummy bit line structure BL_D disposed on the substrate 101 in the second region R2, an insulation liner 152, and interlayer insulating layers 156 and 158.

The semiconductor device 100 may include, for example, a cell array of a dynamic random access memory (DRAM). For example, the bit line BL is connected to the first impurity region 105a of the active region ACT, and the second impurity region 105b of the active region ACT may be electrically connected to the data storage structure 170 capable of storing data on the upper conductive pattern 160, for example, a memory cell capacitor of a DRAM, through the lower and upper conductive patterns 150 and 160. Also, the memory cell capacitor may include, for example, a lower electrode, a capacitor dielectric layer, and an upper electrode, and the structure is not particularly limited.

The substrate 101 may include a semiconductor material, for example, a group IV semiconductor, a group III-V compound semiconductor, or a group II-VI compound semiconductor. For example, the group IV semiconductor may include silicon, germanium, or silicon-germanium. The substrate 101 may further include impurities. The substrate 101 may include a silicon substrate, a silicon on insulator (SOI) substrate, a germanium substrate, a germanium on insulator (GOI) substrate, a silicon-germanium substrate, or a substrate including an epitaxial layer.

The active regions ACT may be defined in the substrate 101 by the device isolation region 110. The active region ACT may have a bar shape, and may be disposed in an island shape extending in one direction within the substrate 101. The one direction may be a direction inclined with respect to the extension directions of the word lines WL and the bit lines BL. The active regions ACT are arranged parallel to each other, and an end of one active area ACT may be arranged to be adjacent to a center of another active area ACT adjacent thereto.

The active region ACT may have first and second impurity regions 105a and 105b having a predetermined depth from the top surface of the substrate 101. The first and second impurity regions 105a and 105b may be spaced apart from each other. The first and second impurity regions 105a and 105b may serve as source/drain regions of a transistor formed by the word line WL. For example, a drain region may be formed between two word lines WL crossing one active region ACT, and source regions may be respectively formed outside the two word lines WL. The source region and the drain region are formed by first and second impurity regions 105a and 105b by doping or ion implantation with substantially the same impurities, and may be referred to interchangeably depending on the circuit configuration of the finally formed transistor. The impurities may include dopants having a conductivity type opposite to that of the substrate 101. In example embodiments, depths of the first and second impurity regions 105a and 105b in the source region and the drain region may be different from each other.

The device isolation region 110 may be formed by a shallow trench isolation (STI) process. The device isolation region 110 surrounds each of the active regions ACT and electrically isolates them from each other. The device isolation region 110 may be formed of an insulating material, for example, silicon oxide, silicon nitride, or a combination thereof. The device isolation region 110 may include a plurality of regions having different bottom depths according to the width of the trench in which the substrate 101 is etched.

The device isolation region 110 may include a first device isolation layer 110A defining the cell active region ACT in the cell array region CAR of the first region R1, and a second device isolation layer 110C disposed on the substrate 101 in the extension region EXT of the first region R1 and the second region R2.

The word line structures WLS may be disposed in the gate trenches 115 extending in the substrate 101. Each of the word line structures WLS may include a gate dielectric layer 120, a word line WL, and a gate capping layer 125. The 'gate (120, WL)' may be referred to as a structure including both the gate dielectric layer 120 and the word line WL. The word line WL may be referred to as a 'gate electrode', and the word line structure WLS may be referred to as a 'gate structure'.

The word line WL may be disposed to extend in the first direction X across the active area ACT. The word line WL may extend in the first direction X on the first region R1 and extend onto the second region R2. For example, a pair of adjacent word lines WL may be disposed to cross one active area ACT. The word line WL may constitute a gate of a buried channel array transistor (BCAT), but is not limited thereto. In example embodiments, the word lines WL may have a shape disposed on the substrate 101. The word line WL may be disposed below the gate trench 115 to have a predetermined thickness. The upper surface of the word line WL may be positioned at a level lower than the upper surface of the substrate 101. The high and low of the term "level" may be defined based on a substantially flat top surface of the substrate 101.

The word line WL may be formed of a conductive material, for example, at least one of polycrystalline silicon (Si), titanium (Ti), titanium nitride (TiN), tantalum (Ta), tantalum nitride (TaN), tungsten (W), or tungsten nitride (WN).), and aluminum (Al). For example, the word line WL may include a lower pattern 121 and an upper pattern 122 formed of different materials.

For example, the lower pattern 121 may include at least one of tungsten (W), titanium (Ti), tantalum (Ta), tungsten nitride (WN), titanium nitride (TiN), and tantalum nitride (TaN). For example, the upper pattern 122 may be a semiconductor pattern including polysilicon doped with P-type or N-type impurities, and the lower pattern 121 may be a metal pattern including at least one of a metal and a metal nitride. The thickness of the lower pattern 121 may be thicker than the thickness of the upper pattern 122. Each of the lower pattern 121 and the upper pattern 122 may extend in the first direction (X).

The gate dielectric layer 120 may be disposed on the bottom and inner surfaces of the gate trench 115. The gate dielectric layer 120 may conformally cover the inner wall of the gate trench 115. The gate dielectric layer 120 may include at least one of silicon oxide, silicon nitride, and silicon oxynitride. The gate dielectric layer 120 may be, for example, a silicon oxide film or an insulating film having a high dielectric constant. In example embodiments, the gate dielectric layer 120 may be a layer formed by oxidizing the active region ACT or a layer formed by deposition.

The gate capping layer 125 may be disposed to fill the gate trench 115 on the word line WL. The top surface of the gate capping layer 125 may be positioned at substantially the same level as the top surface of the substrate 101. The gate capping layer 125 may be formed of an insulating material, for example, silicon nitride.

A structure including the substrate 101, the active region ACT, the first and second impurity regions 105a and 105b, the device isolation region 110, and the word line structure WLS may be referred to as 'lower structure'. The lower structure may include the substrate 101, the active region ACT, the first and second impurity regions 105a and 105b, the device isolation region 110, and the word line structure WLS.

The bit line structures BLS may extend in one direction, for example, the second direction Y, perpendicular to the word line WL. The bit line structures BLS may extend in the second direction Y on the first region R1 and extend onto the second region R2. The bit line structures BLS may be disposed to be spaced apart from each other along the first direction X in the first region R1.

The bit line structures BLS may include a first portion BLS1 disposed on the cell array region CAR and a second portion BLS2 disposed on the extension area EXT, respectively. The bit line structures BLS may have different widths, in the first direction X, in the first portion BLS1 and the second portion BLS2. In example embodiments, the first portion BLS1 of the bit line structures BLS has a first width, and the second portion BLS2 of the bit line structures BLS may have a second width greater than the first width. As illustrated in the cross-section of line A-A' in FIG. 2, the second portion BLS2 of the bit line structures BLS may be disposed on the device isolation region 110. Oxygen radicals generated in the device isolation region 110 disposed below the second portion BLS2 of the bit line structures BLS may damage the bit line BL. By securing a relatively large width of the second portion BLS2 of the bit line structure BLS, breakage failure of the bit line structures BLS disposed on the extension area EXT may be prevented. Thereby, the reliability of the semiconductor device 100 may be improved.

The dummy bit line structure BL_D may be spaced apart from the bit line structures BLS in the first direction X and disposed on the second region R2. The dummy bit line structure BL_D may extend in the second direction Y in the same manner as the bit line structures BLS. The dummy bit line structures BL_D may have a greater width in the first direction X than the bit line structures BLS. The dummy bit line structure BL_D may have a structure similar to that of the bit line structures BLS, except that it has a large width.

The bit line structures BLS may include a bit line BL and a bit line capping pattern BC on the bit line BL. The bit line BL may include a first conductive pattern 141, a second conductive pattern 142, and a third conductive pattern 143 that are sequentially stacked. The bit line capping pattern BC may be disposed on the third conductive pattern 143. A buffer insulating layer 128 may be disposed between the first conductive pattern 141 and the substrate 101, and a portion of the first conductive pattern 141 (hereinafter, the bit line contact pattern DC) may contact the first impurity region 105a of the active region ACT. Each bit line BL may be electrically connected to the first impurity region 105a through a bit line contact pattern DC. The lower surface of the bit line contact pattern DC may be located at a level lower than the upper surface of the substrate 101, and may be located at a level higher than the upper surface of the word line WL. In an example embodiment, the bit line contact pattern DC may be formed in the substrate 101 to be locally disposed in the bit line contact hole 135 exposing the first impurity region 105a.

The first conductive pattern 141 may include a semiconductor material such as polycrystalline silicon. The first conductive pattern 141 may directly contact the first impurity region 105a. The second conductive pattern 142 may include a metal-semiconductor compound. The metal-semiconductor compound may be, for example, a layer in which a portion of the first conductive pattern 141 is silicided. For example, the metal-semiconductor compound may include cobalt silicide (CoSi), titanium silicide (TiSi), nickel silicide (NiSi), tungsten silicide (WSi), or other metal silicides. The third conductive pattern 143 may include a metal material such as titanium (Ti), tantalum (Ta), tungsten (W), and aluminum (Al). The number of conductive patterns forming the bit line BL, the type of material, and/or the stacking order may be variously changed according to example embodiments.

The bit line capping pattern BC may include a first capping pattern 146, a second capping pattern 147, and a third capping pattern 148 sequentially stacked on the third conductive pattern 143. Each of the first to third capping patterns 146, 147, and 148 may include an insulating material, for example, a silicon nitride layer. The first to third capping patterns 146, 147, and 148 may be formed of the same or different materials. When the same material is included in the first to third capping patterns 146, 147, and 148, boundaries may be distinguished between the capping patterns due to a difference in physical properties. A thickness of the second capping pattern 147 may be smaller than a thickness of the first capping pattern 146 and a thickness of the third capping pattern 148, respectively. The number of capping patterns and/or the type of material constituting the bit line capping pattern BC may be variously changed according to example embodiments.

The bit line spacers SS may be disposed on both sidewalls of each of the bit line structures BLS to extend in one direction, for example, the Y-direction. The bit line spacers SS may be disposed between the bit line structures BLS and the lower conductive pattern 150. The bit line spacers SS may be disposed to extend along sidewalls of the bit line BL and sidewalls of the bit line capping pattern BC. A pair of bit line spacers SS disposed on both sides of one bit line structures BLS may have an asymmetric shape with respect to the bit line structures BLS. Each of the bit line spacers SS may include a plurality of spacer layers, and may further include an air spacer according to example embodiments.

The lower conductive pattern 150 may be connected to one region of the active region ACT, for example, the second impurity region 105b. The lower conductive pattern 150 may be disposed between the bit lines BL and between the word lines WL. The lower conductive pattern 150 may pass through the buffer insulating layer 128 to be connected to the second impurity region 105b of the active region ACT. The lower conductive pattern 150 may directly contact the second impurity region 105b. The lower surface of the lower conductive pattern 150 may be located at a level lower than the upper surface of the substrate 101, and may be located at a higher level than the lower surface of the bit line contact pattern DC. The lower conductive pattern 150 may be insulated from the bit line contact pattern DC by the bit line spacer SS. The lower conductive pattern 150 may be formed of a conductive material, and for example, may include at least one of polycrystalline silicon (Si), titanium (Ti), titanium nitride (TiN), tantalum (Ta), tantalum nitride (TaN), tungsten (W), tungsten nitride (WN), and aluminum (Al).

A metal-semiconductor compound layer 155 may be disposed between the lower conductive pattern 150 and the upper conductive pattern 160. The metal-semiconductor compound layer 155 may be a layer in which a portion of the lower conductive pattern 150 is silicided, for example, when the lower conductive pattern 150 includes a semiconductor material. The metal-semiconductor compound layer 155 may include, for example, cobalt silicide (CoSi), titanium silicide (TiSi), nickel silicide (NiSi), tungsten silicide (WSi), or other metal silicide. In some example embodiments, the metal-semiconductor compound layer 155 may be omitted.

The first upper conductive pattern 160 may be disposed on the lower conductive pattern 150 in the first region R1. The upper conductive pattern 160 may extend between the bit line spacers SS to cover the upper surface of the metal-semiconductor compound layer 155. Also, the upper conductive pattern 160 may include a barrier layer and a conductive layer. The barrier layer may cover the underside and sides of the conductive layer. The barrier layer may include a metal nitride, for example, at least one of titanium nitride (TiN), tantalum nitride (TaN), and tungsten nitride (WN). The conductive layer may be formed of a conductive material, and may include at least one of, for example, polycrystalline silicon (Si), titanium (Ti), tantalum (Ta), tungsten (W), ruthenium (Ru), copper (Cu), molybdenum (Mo), platinum (Pt), nickel (Ni), cobalt (Co), aluminum (Al), titanium nitride (TiN), tantalum nitride (TaN), and tungsten nitride (WN).

The insulating patterns 165 may be disposed to penetrate the upper conductive pattern 160. A plurality of upper conductive patterns 160 may be separated by insulating patterns 165. The insulating patterns 165 may include an insulating material, for example, at least one of silicon oxide, silicon nitride, and silicon oxynitride.

FIGS. 4A, 4B, 5A, 5B, 6A, 6B, 7A, 7B, 8A, 8B, 9A, and 9B, illustrate a method of manufacturing a semiconductor device according to example embodiments. FIGS. 4A, 5A, 6A, 7A, 8A, and 9A are layout views corresponding to FIG. 1. FIGS. 4B, 5B, 6B, 7B, 8B, and 9B are cross-sectional views corresponding to FIG. 2. For convenience of description, the illustration of the lower structure below the buffer insulating layer 128 in FIGS. 4A to 9B will be omitted.

First, a process of forming the lower structure will be described with reference to FIGS. 2 and 3. The device isolation region 110 may be formed on the substrate 101 to define the cell active region ACT in the cell array region CAR of the first region R1. A device isolation trench may be formed in the substrate 101, and the device isolation region 110 may fill the device isolation trench. In plan view, the active area ACT may have an elongated bar shape. Impurity regions may be formed on the active region ACT by performing an ion implantation process. The active region ACT and the device isolation region 110 may be patterned to form the gate trench 115. A pair of gate trenches 115 may cross the active region ACT, but is not limited thereto. The impurity regions may also be separated by the gate trench 115 to form a first impurity region 105a and a second impurity region 105b.

The gate dielectric layer 120 may be formed on the inner surface of the gate trench 115 to have a substantially conformal thickness. Subsequently, the lower pattern 121 and the upper pattern 122 may be formed to fill the gate trench 115, and the upper portion of the upper pattern 122 may be partially etched to form the word line WL. The upper surface of the word line WL may be recessed to be lower than the upper surface of the active region ACT. A gate capping layer 125 may be formed on the word line WL by stacking an insulating layer on the substrate 101 to fill the gate trench 115 and etching. Accordingly, the word line structure WLS may be formed. Thereby, the lower structure may include the substrate 101, the active region ACT, the first and second impurity regions 105a and 105b, the device isolation region 110, and the word line structure WLS.

Thereafter, a buffer insulating layer 128 covering the word line structure WLS and the device isolation region 110 may be formed on the substrate 101. The buffer insulating layer 128 may be formed of at least one of silicon oxide, silicon nitride, and silicon oxynitride.

Figure 4A:
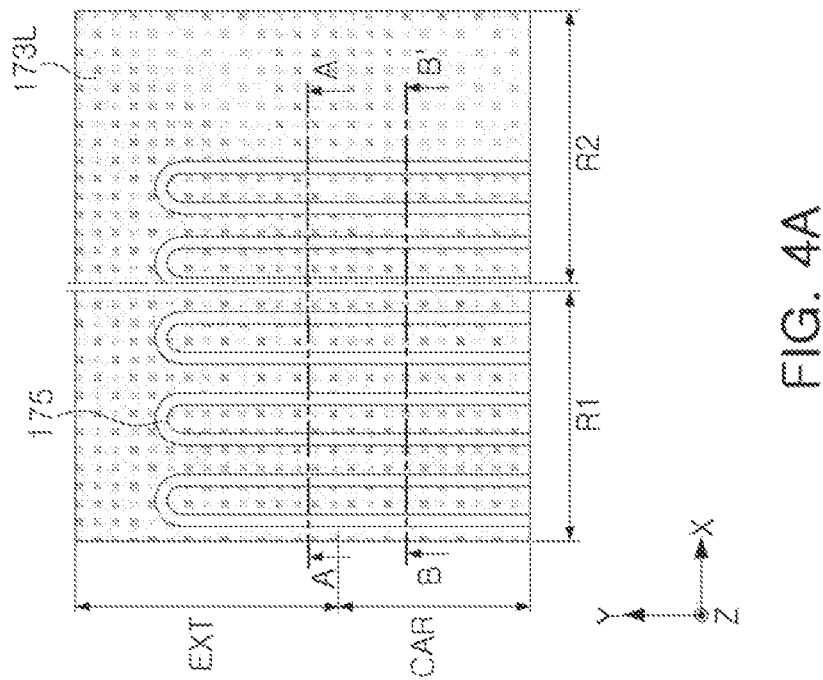
FIGS. 4A, 5A, 6A, 7A, 8A, 9A, 10A, 11A, and 12A are schematic layout diagrams illustrating a method of manufacturing a semiconductor device according to example embodiments.
Figure 4B:
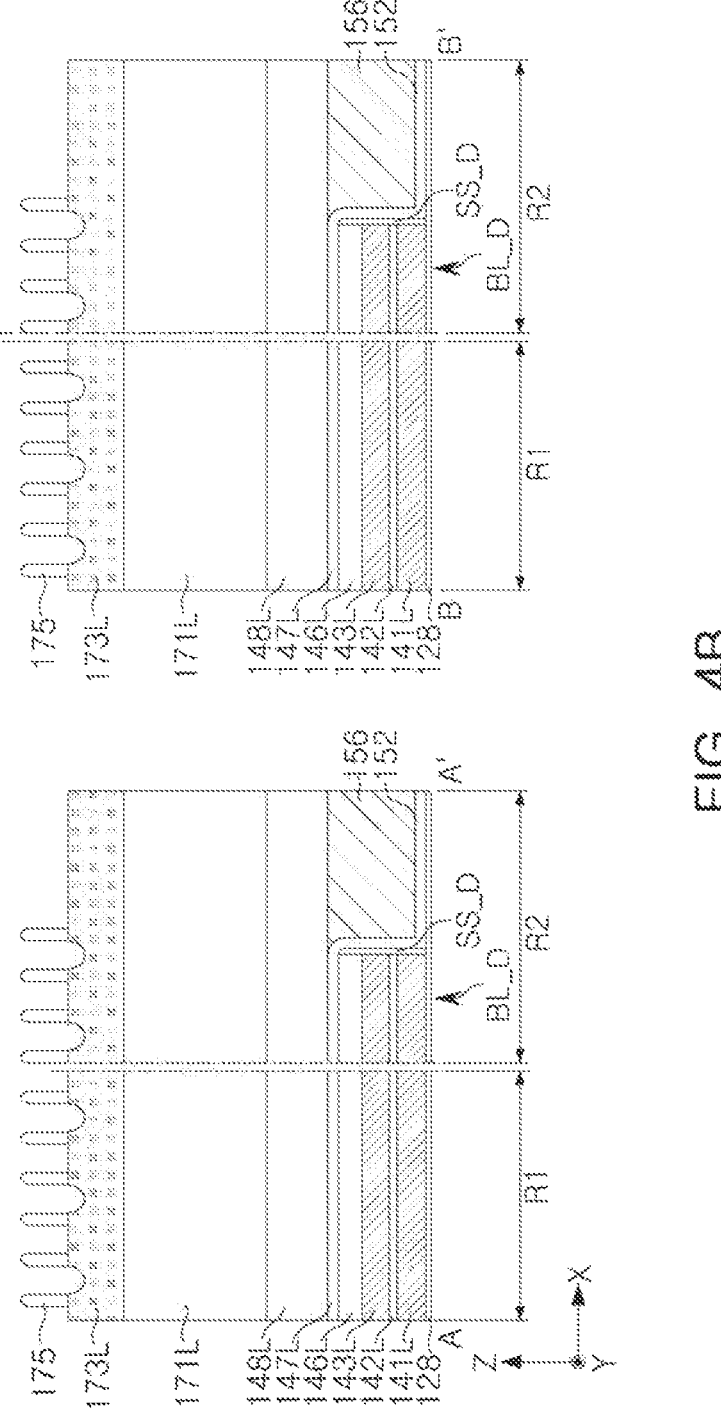
FIGS. 4B, 5B, 6B, 7B, 8B, 9B, 10B, 11B, and 12B are cross-sectional views illustrating a method manufacturing a semiconductor device according to example embodiments.

Referring to FIGS. 4A and 4B, first to third conductive layers 141L, 142L, and 143L, a first capping layer 146L, and a second capping layer 147L may be formed on the first region R1. The first conductive layer 141L may further include a bit line contact pattern (DC in FIG. 3) electrically connected to the impurity region (105a in FIGS. 2 and 3) of the active region (ACT in FIGS. 2 and 3). Forming the first conductive layer 141L may include forming a bit line contact hole (135 in FIG. 3) exposing the first impurity region (105a in FIG. 3), forming a layer of a first conductive material filling the bit line contact hole (135 in FIG. 3), and forming a second conductive material layer on the first conductive material layer.

A dummy bit line structure BL_D may be formed on the second region R2. A dummy spacer structure SS_D may be formed on a side surface of the dummy bit line structure BL_D. An insulating liner 152 covering the dummy bit line structure BL_D may be formed, and a first interlayer insulating layer 156 may be formed on the insulating liner 152. The second capping layer 147L, the insulating liner 152 and the first interlayer insulating layer 156 may include top surfaces positioned at the same level.

A third capping layer 148L, a first mask layer 171L, and a second mask layer 173L may be formed on the first region R1 and the second region R2. A structure including the first to third conductive layers 141L, 142L, and 143L and the first to third capping layers 146L, 147L, and 148L may be referred to as a 'spare bit line structure'.

Spacer patterns 175 in the shape of parallel lines or bars extending in one direction, for example, the second direction Y, may be formed on the second mask layer 173L. In example embodiments, the spacer patterns 175 may be formed by double patterning (DPT). For example, after forming a line-shaped sacrificial material extending in the second direction (Y) direction, and after forming a spacer layer surrounding the side surfaces of the sacrificial material, spacer patterns 175 may be formed by the method of removing the sacrificial material. However, the method of forming the spacer patterns 175 is not limited thereto. In other example embodiments, the spacer patterns 175 may be formed by quadruple patterning.

As illustrated in FIG. 4A, the spacer patterns 175 may include line portions having parallel line shapes and "U"-shaped edge portions connecting adjacent line portions. However, the shape of the spacer patterns 175 is not limited thereto. In other example embodiments, the spacer patterns 175 may include only line portions extending in one direction.

Figure 5A:
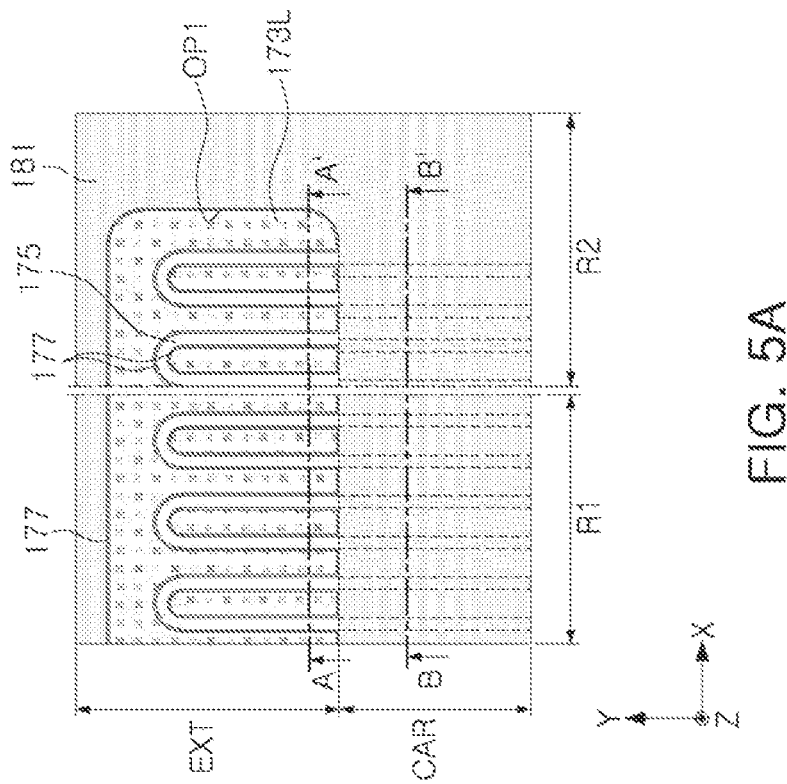
Figure 5B:
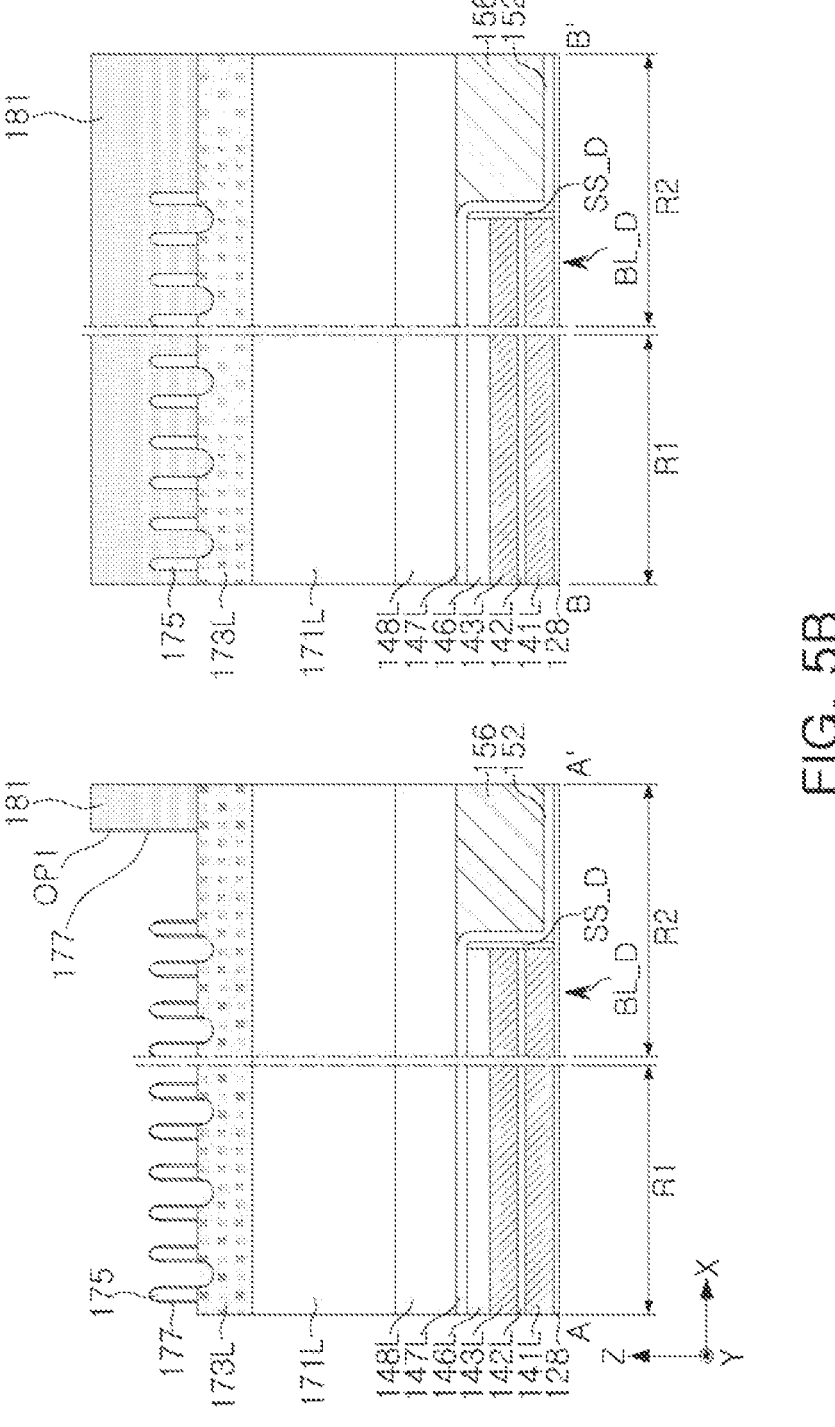

Referring to FIGS. 5A and 5B, a first photoresist mask 181 having a first opening OP1 may be formed on the second mask layer 173L and the spacer patterns 175. The first opening OP1 may expose a portion of the extension area EXT of the first area R1 and a portion of the second area R2. A portion of the spacer patterns 175 may be exposed by the first opening OP1.

Thereafter, material layers 177 may be formed on the side surfaces of the spacer patterns 175 and the side surfaces of the first photoresist mask 181. Forming the material layers 177 may include forming a material layer along the top surface and side surfaces of the spacer patterns 175, the top surface of the second mask layer 173L, and the top surface and side surfaces of the first photoresist mask 181, and then, removing the material layer formed on the upper surface of the spacer patterns 175, the upper surface of the second mask layer 173L, and the upper surface of the first photoresist mask 181. Accordingly, material layers 177 may be formed on the side surfaces of the spacer patterns 175 and the side surfaces of the first photoresist mask 181. The spacer patterns 175 and the first material layers 177 may be referred to as a 'spacer structure (ST).'

The material layers 177 may be formed using atomic layer deposition (ALD). Each of the material layers 177 may have a thickness of about 20 Å or less. In example embodiments, a thickness of each of the material layers 177 maybe in a range from about 10 Å to about 20 Å.

Figure 6A:
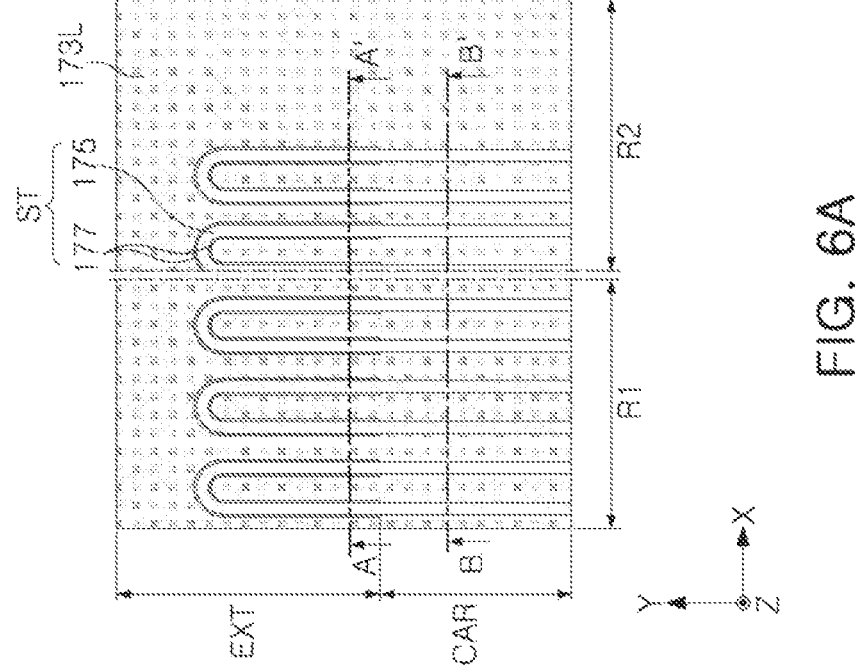
Figure 6B:
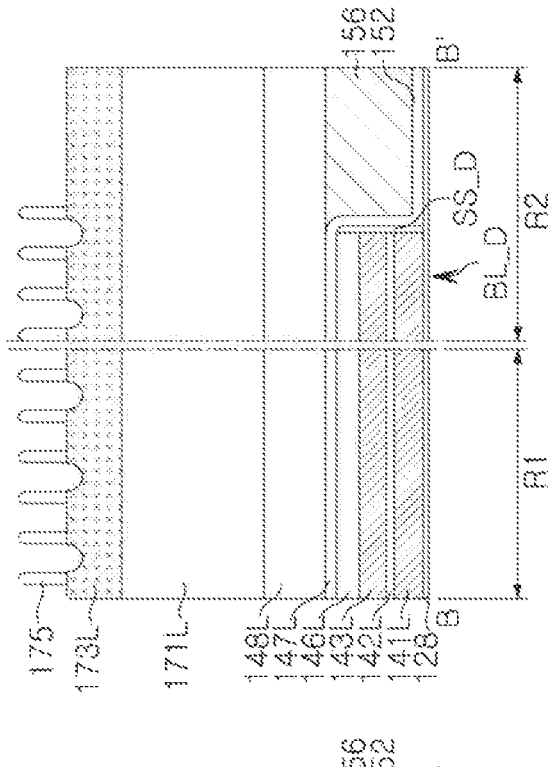
Figure 6B:
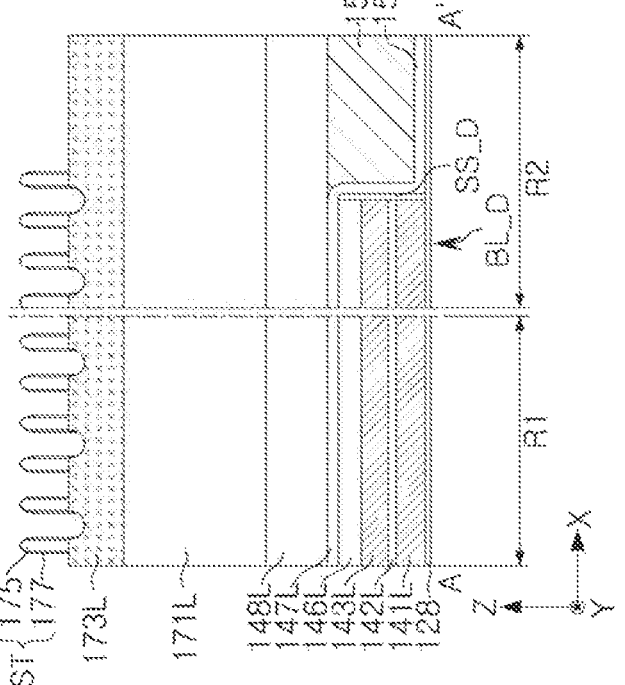

Referring to FIGS. 6A and 6B, after the material layers 177 are formed, the first photoresist mask 181 may be removed. In the process of removing the first photoresist mask 181, the material layers 177 formed on the side surface of the first photoresist mask 181 may be removed together. Accordingly, the material layers 177 may remain only on the side surfaces of the spacer patterns 175.

Figure 7A:
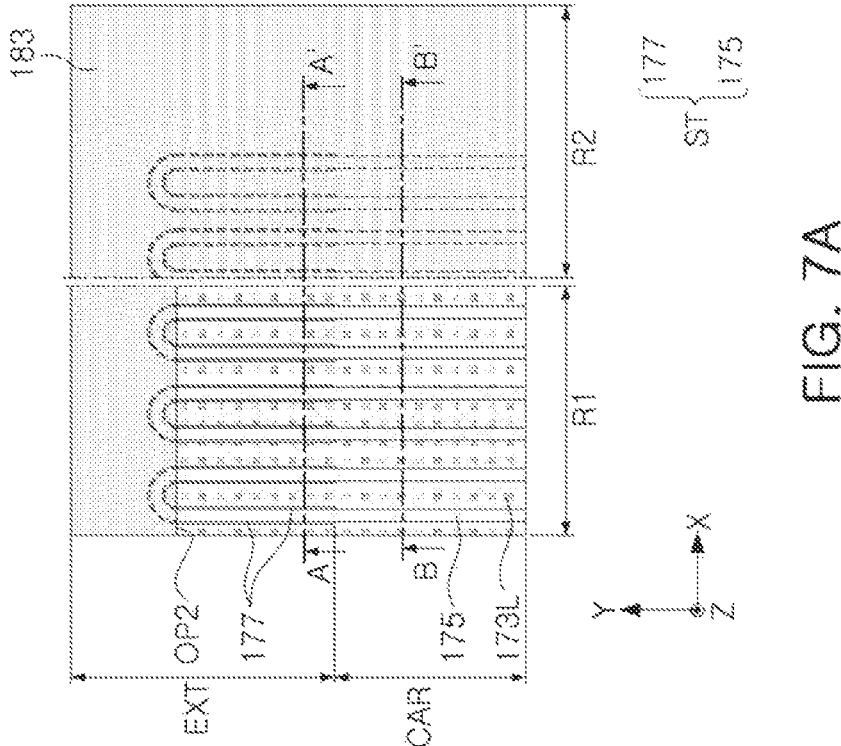
Figure 7B:
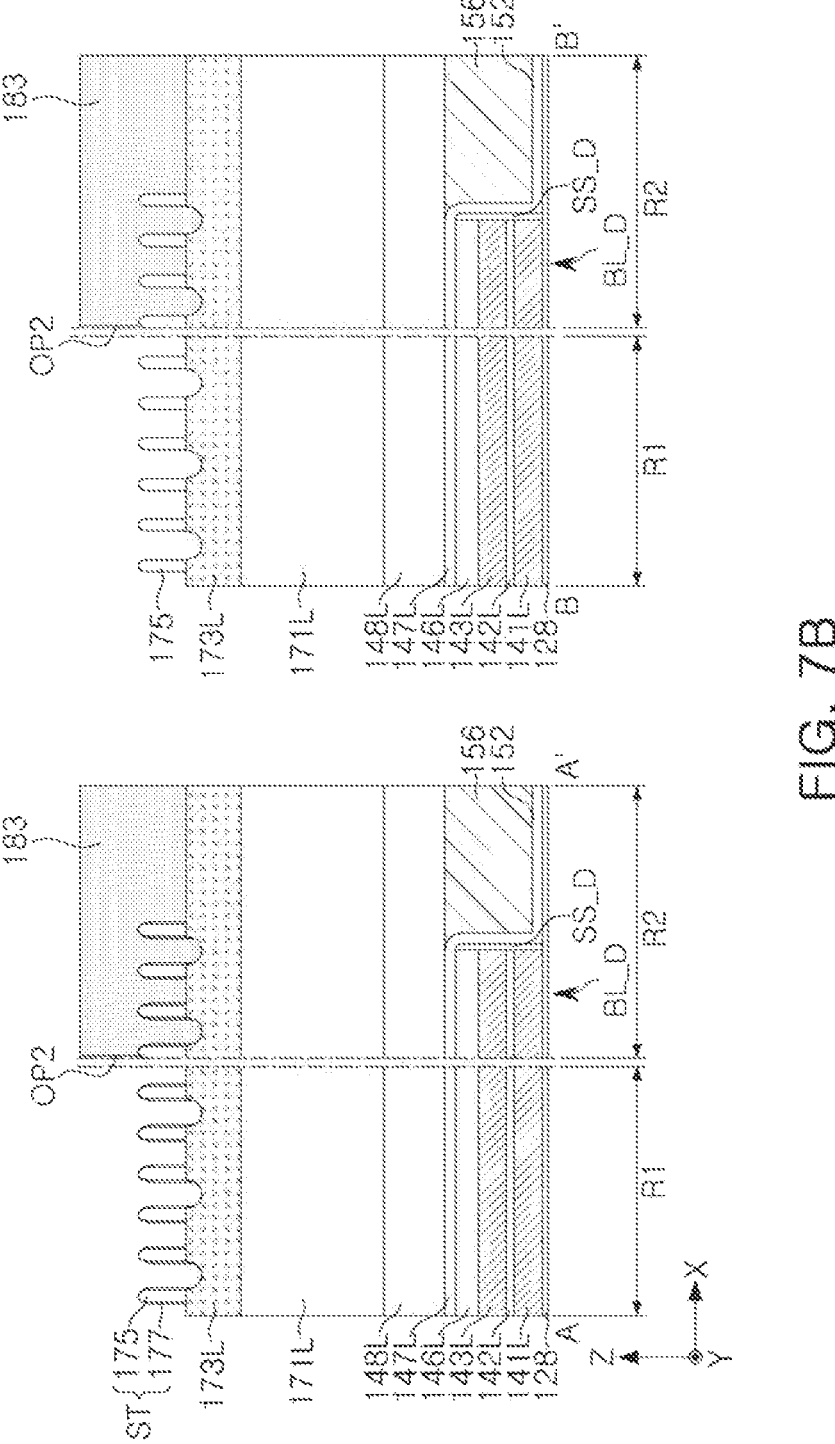

Referring to FIGS. 7A and 7B, a second photoresist mask 183 having a second opening OP2 may be formed on the second mask layer 173L and the spacer patterns 175. The second opening OP2 may expose a portion of the first region R1. The second opening OP2 may expose a portion of the cell array region CAR of the first region R1 and the extension region EXT.

Figure 8A:
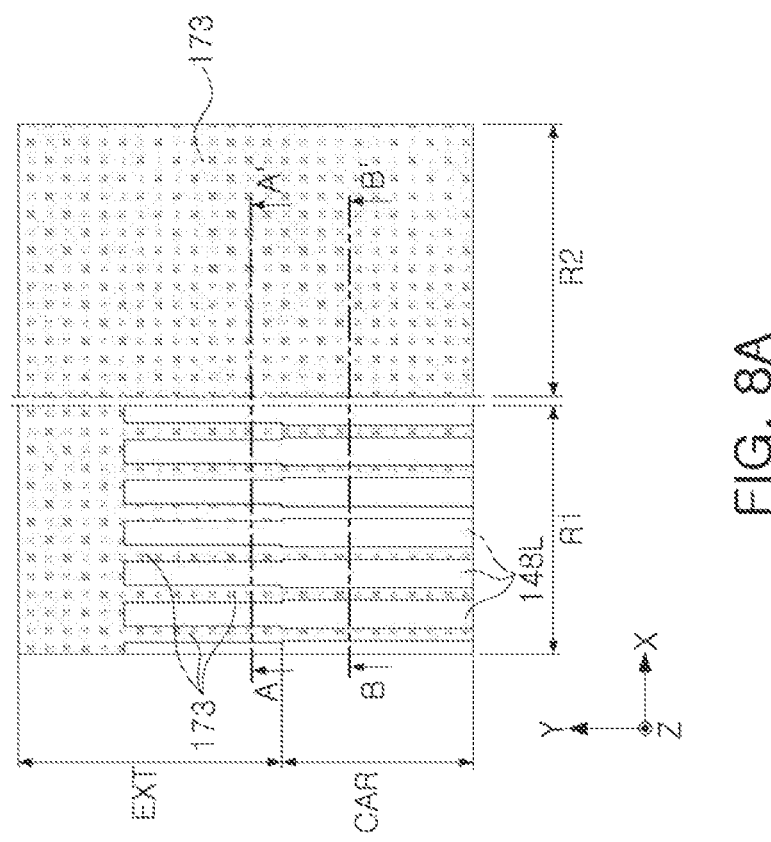
Figure 8B:
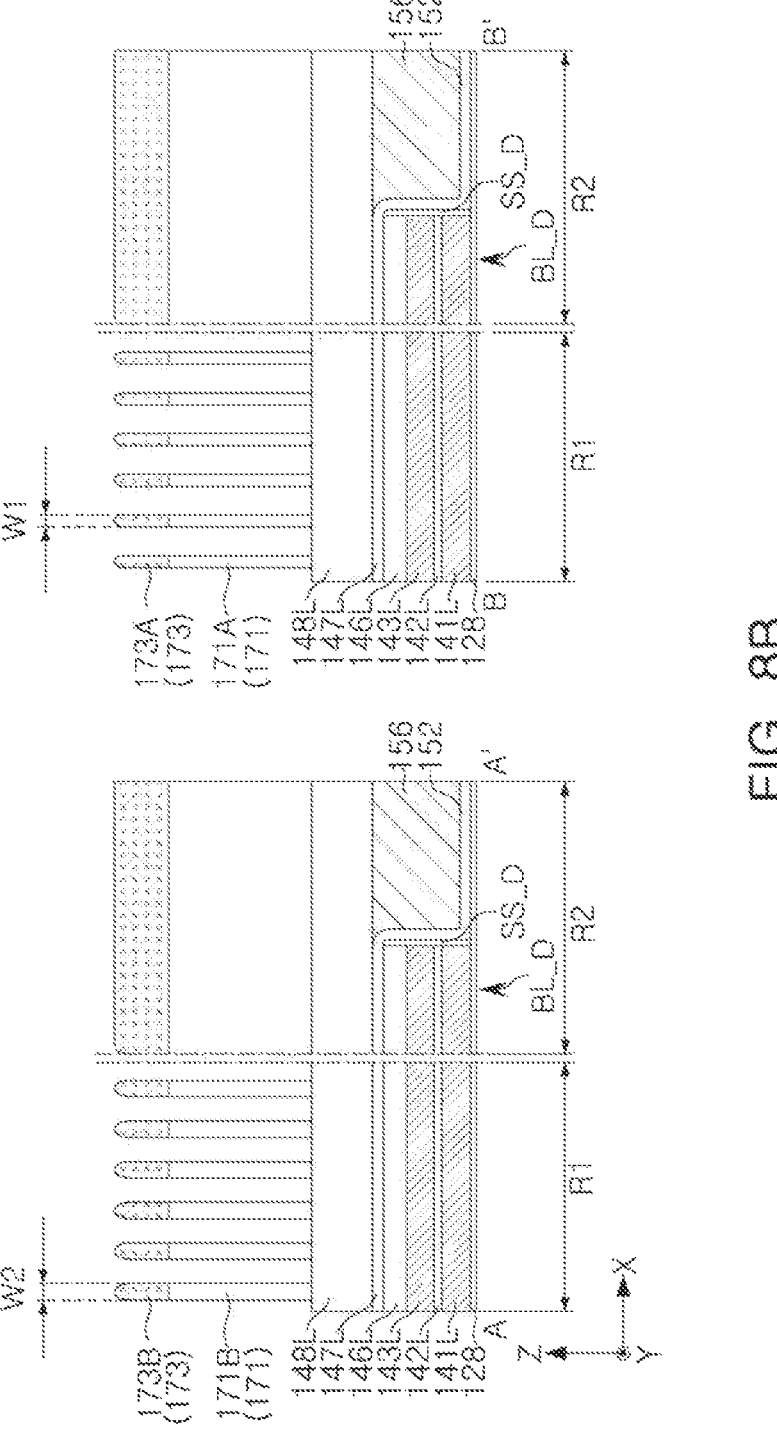

Referring to FIGS. 8A and 8B, in the region exposed by the second opening OP2 of FIGS. 7A and 7B of the second photoresist mask 183, the spacer patterns 175 and the first material layer 177 are used as etching masks to form first and second etching masks. The mask layers 171L and 173L of FIGS. 7A and 7B may be patterned. Thereby, a plurality of first mask patterns 171 and second mask patterns 173 by patterning the mask layers 171L and 173L using the spacer patterns 175 and the first material layer 177 as an etching mask may be formed. The plurality of first mask patterns 171 spaced apart from each other in the first direction X may be formed. The plurality of second mask patterns 173 spaced apart from each other in the first direction X may be formed.

The first and second mask patterns 171A and 173A on the cell array region CAR of the first region R1 may be formed by patterning the mask layers 171L and 173L using the spacer patterns 175 as an etching mask. Each of the first and second mask patterns 171A and 173A on the cell array region CAR of the first region R1 may have a first width W1. The first and second mask patterns 171B and 173B on the extension region EXT of the first region R1 may be formed by patterning the mask layers 171L and 173L using the spacer patterns 175 and the first material layer 177 as an etching mask. Each of the first and second mask patterns 171B and 173B on the extension region EXT of the first region R1 may have a second width W2. The second width W2 may be greater than the first width W1.

Figure 9A:
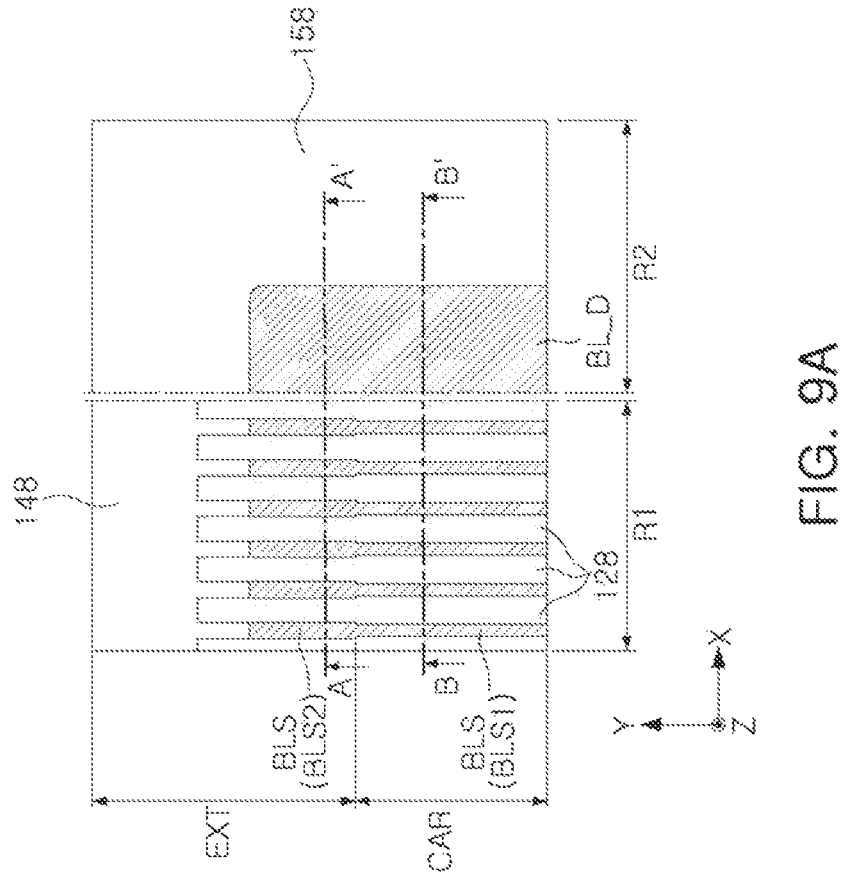
Figure 9B:
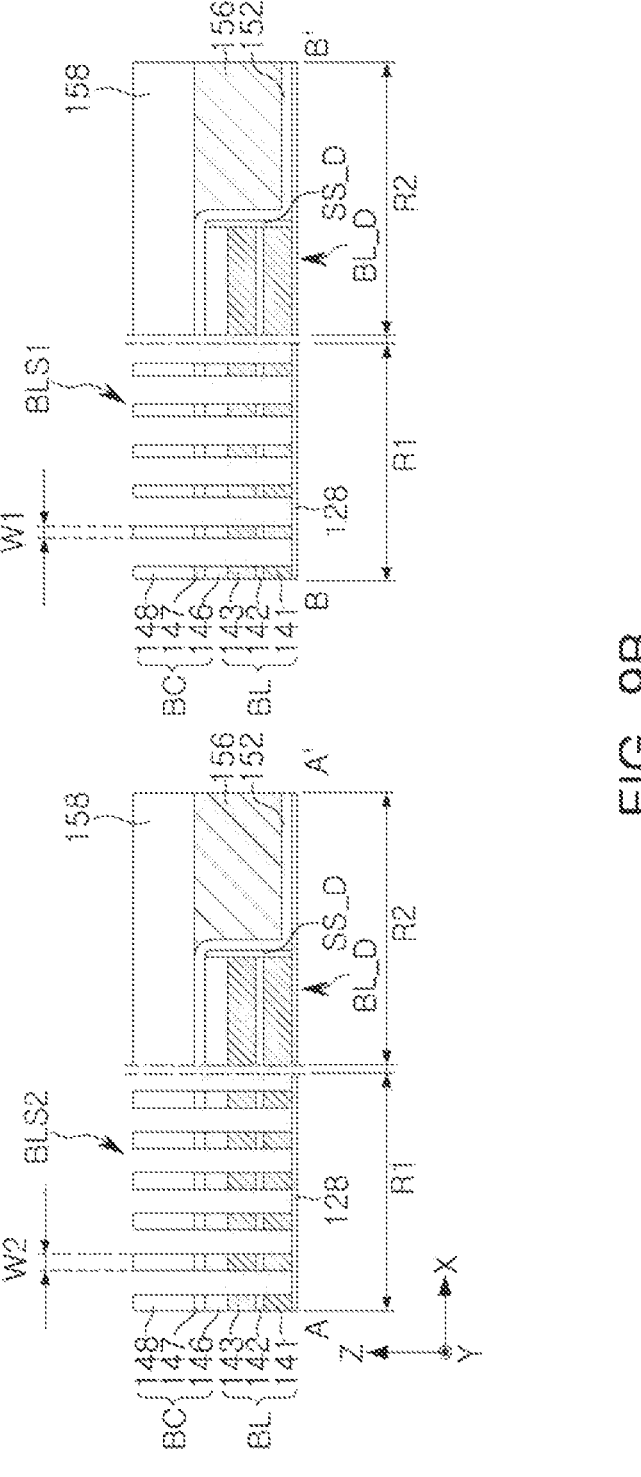

Referring to FIGS. 9A and 9B, the first to third conductive layers 141L, 142L, and 143L of FIG. 8B and the first to third capping layers 146L, 147L and 148L of FIG. 8B using the first and second mask patterns 171A, 171B, 173A, and 173B as etching masks may be patterned. Thereby, first to third conductive patterns 141, 142, 143 and first to third capping patterns 146, 147 and 148 may be formed on the first region R1, and a second interlayer insulating layer 158 may be formed on the second region R2. The first to third capping patterns 146, 147 and 148 by patterning the first to third capping layers 146L, 147L and 148L of FIG. 8B using the first and second mask patterns 171A, 171B, 173A, and 173B as etching masks may be formed. The first to third conductive patterns 141, 142, 143 by patterning the first to third conductive layers 141L, 142L, and 143L of FIG. 8B using the first to third capping patterns 146, 147 and 148 and the first and second mask patterns 171A, 171B, 173A, and 173B as etching masks may be formed The first and second mask patterns (171 and 173 of FIG. 8B) used as the etching masks may be removed.

Each of the first to third conductive patterns 141, 142 and 143 and the first to third capping patterns 146, 147 and 148 of the cell array region CAR of the first region R1 may have a first width W1, using the first and second mask patterns (171A and 173A in FIGS. 7A and 7B) having a first width W1 as an etching mask. Each of the first to third conductive patterns 141, 142 and 143 and the first to third capping patterns 146, 147 and 148 of the extension region EXT of the first region R1 may have the second width W2 greater than the first width W1, using the first and second mask patterns (171B and 173B in FIGS. 7A and 7B) having a second width W2 as an etching mask.

The first to third conductive patterns 141, 142, and 143 may constitute the bit line BL, and the first to third capping patterns 146, 147, and 148 may constitute the bit line capping pattern BC. The bit line BL and the bit line capping pattern BC may constitute the bit line structure BLS.

Referring back to FIGS. 1 to 3, bit line spacers SS may be formed on side surfaces of the bit line structure BLS. The bit line spacer SS may be formed of a plurality of layers. Fence insulating patterns 154 may be formed between the bit line spacers SS. The fence insulating patterns 154 may include silicon nitride or silicon oxynitride. Holes exposing the second impurity region 105b may be formed by performing an anisotropic etching process using the fence insulating patterns 154 and the third capping pattern 148 as an etching mask.

A lower conductive pattern 150 may be formed below the holes. The lower conductive pattern 150 may be formed of a receiving conductor material such as polysilicon. For example, the lower conductive pattern 150 may be formed by forming a polysilicon layer filling the holes and then performing an etch-back process. A metal-semiconductor compound layer 155 may be formed on the lower conductive pattern 150. The formation of the metal-semiconductor compound layer 155 may include a metal layer deposition process and a heat treatment process. The upper conductive pattern 160 may be simultaneously formed on the upper portion of the first region R1 and the upper portion of the second region R2.

Thereafter, a patterning process may be performed on the upper conductive pattern 160 to form insulating patterns 165 passing therethrough. Thereafter, a data storage structure (170 of FIG. 3), for example a capacitor structure including a lower electrode, a capacitor dielectric layer, and an upper electrode may be formed on the first upper conductive pattern 160.

Figure 10A:
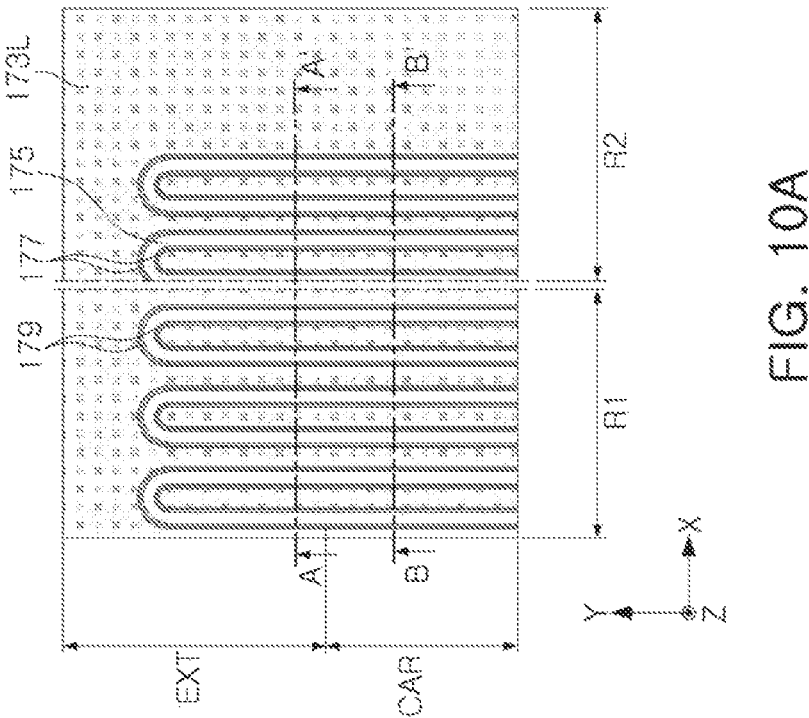
Figure 10B:
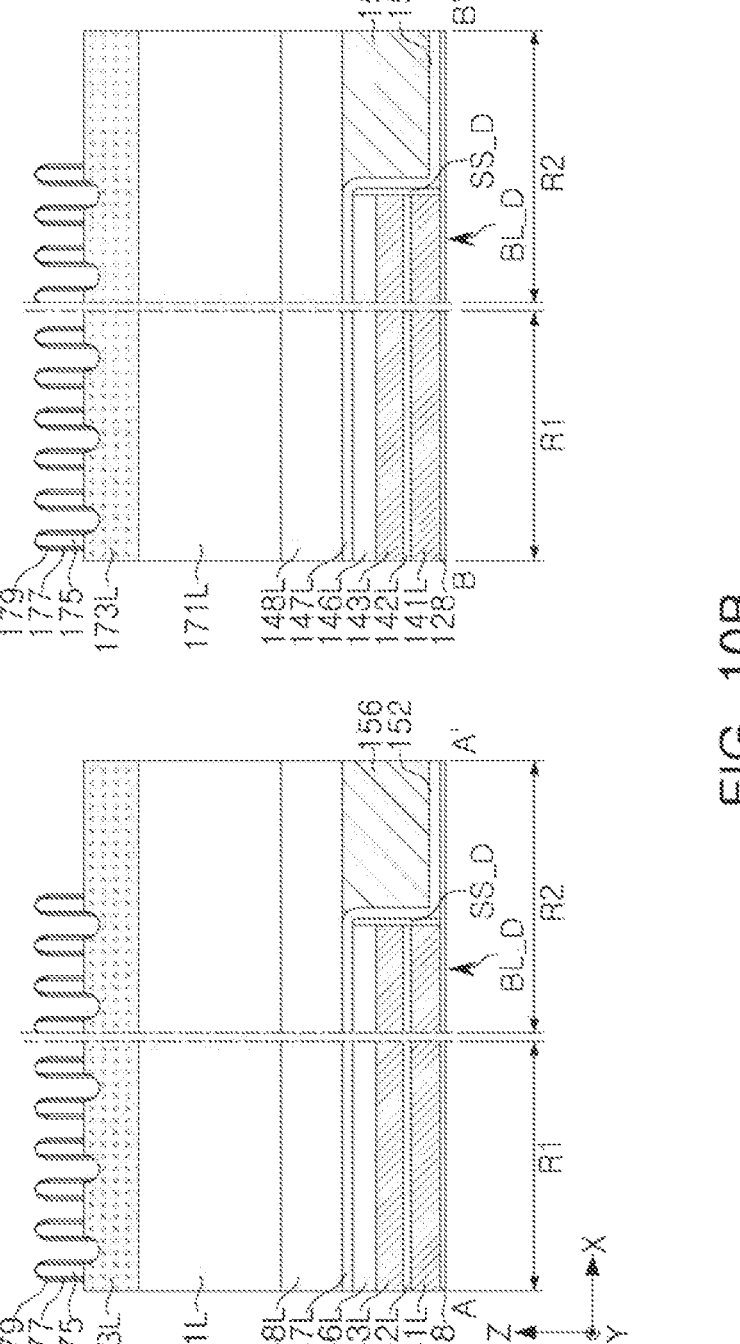
Figure 11A:
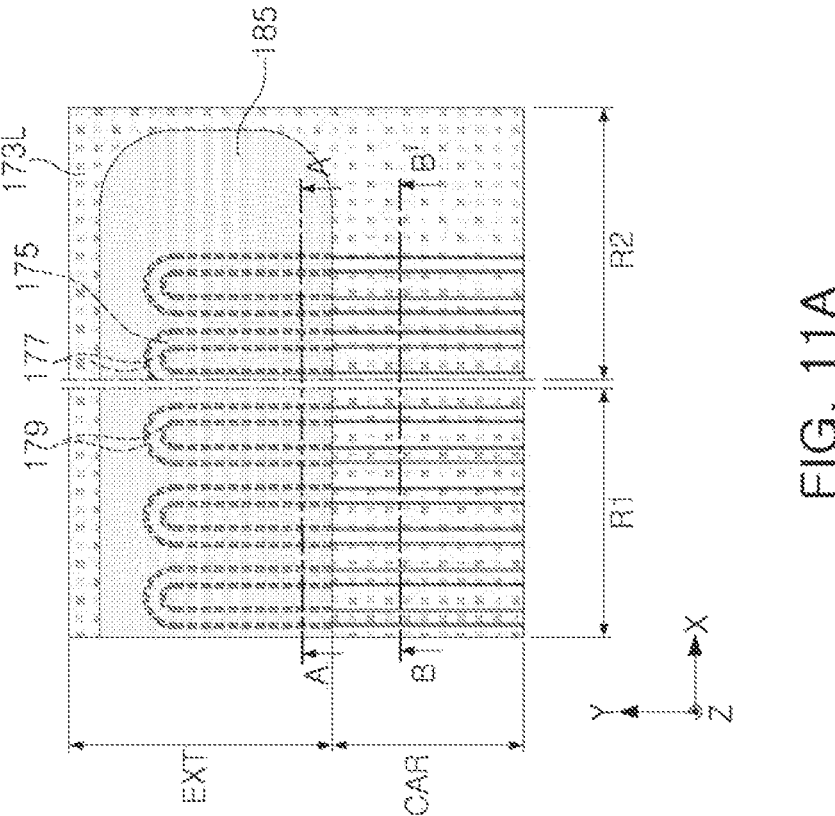
Figure 11B:
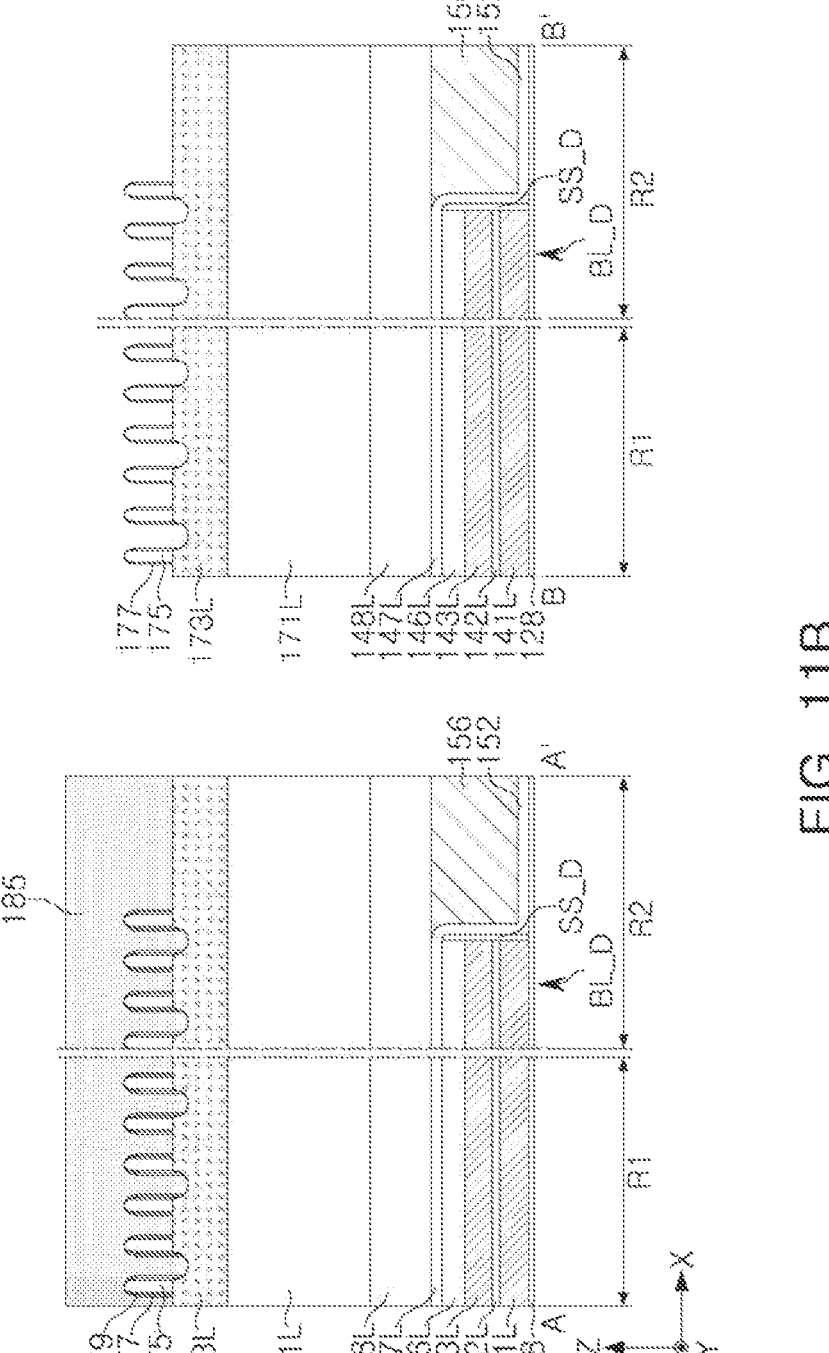
Figure 12A:
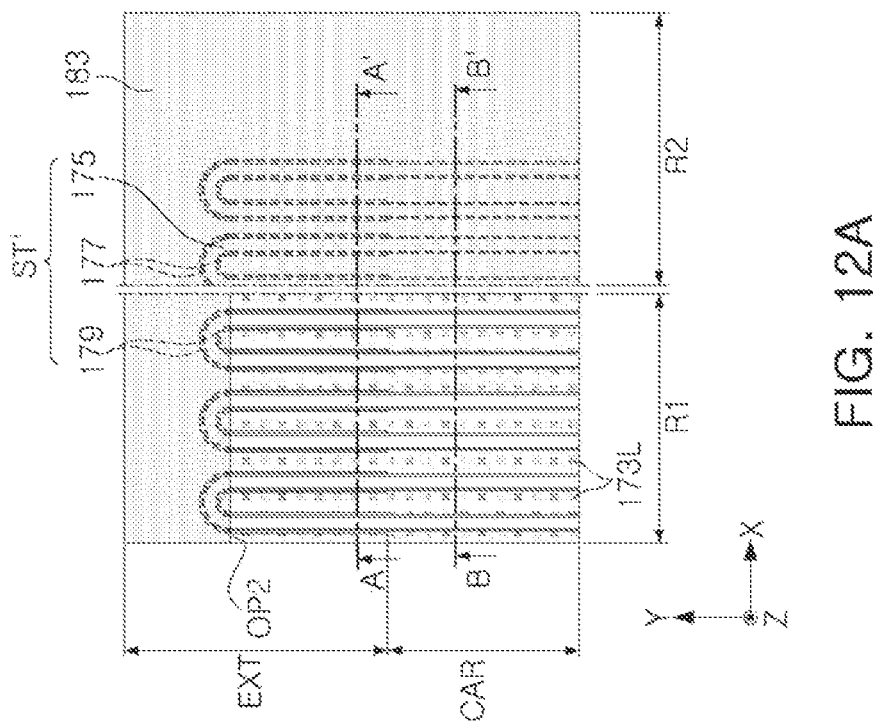
Figure 12B:
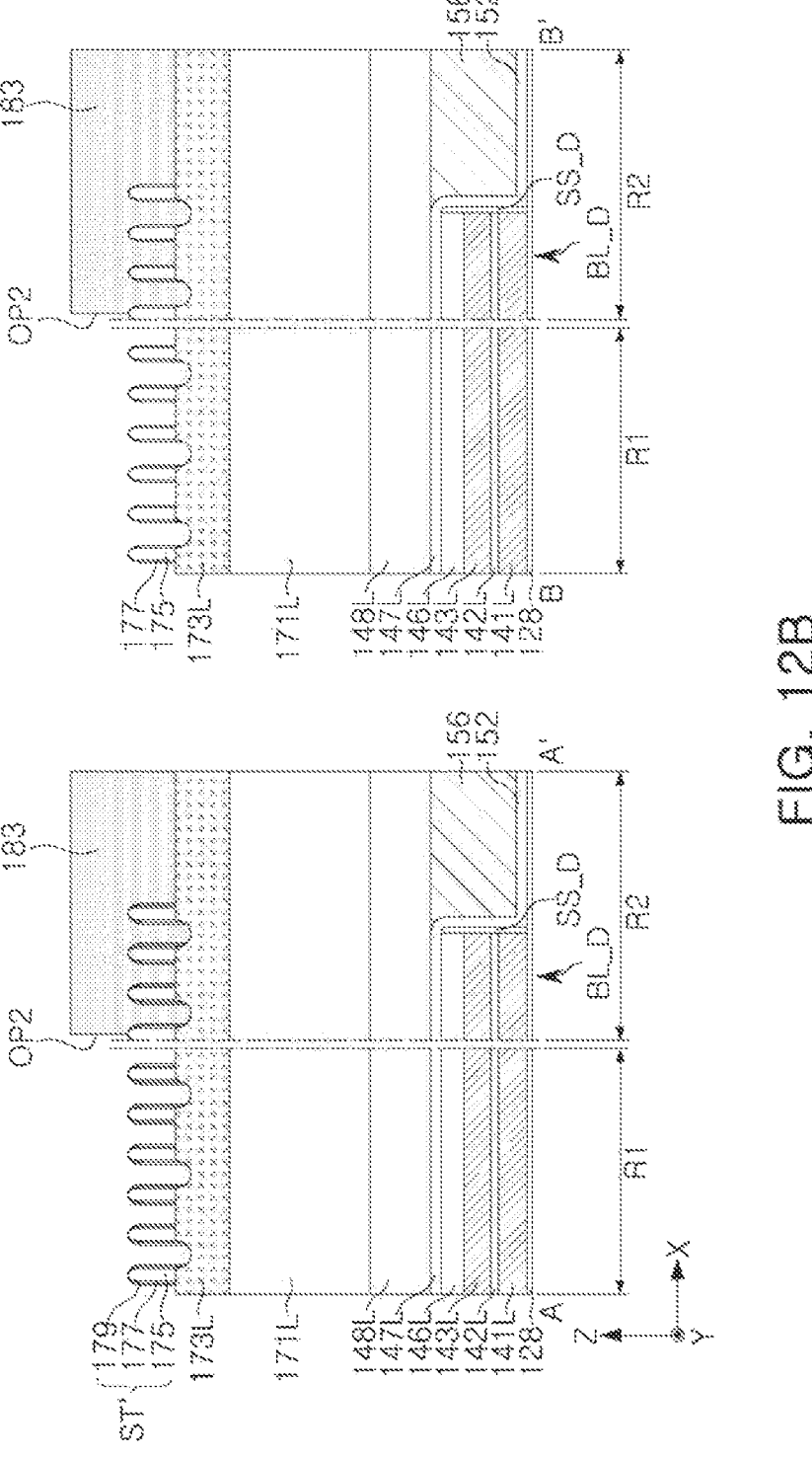

A method of manufacturing a semiconductor device according to example embodiments will be described with reference to FIGS. 10A, 10B, 11A, 11B, 12A, and 12B. FIGS. 10A, 11A, and 12A are layout views corresponding to FIG. 1. FIGS. 10B, 11B and 12B are cross-sectional views corresponding to FIG. 2. For convenience of description, the illustration of the lower structure below the buffer insulating layer 128 in FIGS. 10A to 12B will be omitted. Contents overlapping with those described above with reference to FIGS. 4A to 9B will be omitted.

First, the manufacturing process of FIGS. 4A and 4B may be performed. Thereafter, referring to FIGS. 10A and 10B, first material layers 177 and second material layers 179 may be sequentially formed on side surfaces of the spacer patterns 175. Forming the first material layers 177 and the second material layers 179 may include forming first material layers along the top and side surfaces of the spacer patterns 175, forming second material layers along the top and side surfaces of the first material layers 177, and then, removing the first and second material layers formed on the upper surface of the spacer patterns 175. For example, the first material layers 177 may have an etch selectivity with respect to the second material layers 179.

Referring to FIGS. 11A and 11B, a third photoresist mask 185 may be formed on the second mask layer 173L and the spacer patterns 175. The third photoresist mask 185 may cap a portion of the extension region EXT of the first region R1 and a portion of the second region R2.

Thereafter, in the remaining regions not capped by the third photoresist mask 185, the second material layer 179 may be removed. For example, due to the etch selectivity of the first material layers 177 and the second material layers 179, the second material layers 179 may be removed and the first material layers 177 may remain. Accordingly, in the region capped by the third photoresist mask 185, first material layers 177 and second material layers 179 may be formed on side surfaces of the spacer patterns 175, and in an area not capped by the third photoresist mask 185, first material layers 177 may be formed on the spacer patterns 175. Thereafter, the third photoresist mask 185 may be removed.

Referring to FIGS. 12A and 12B, a second photoresist mask 183 having a second opening OP2 may be formed on the second mask layer 173L and the spacer patterns 175. The second opening OP2 may expose a portion of the first region R1. The second opening OP2 may expose a portion of the cell array region CAR of the first region R1 and the extension region EXT.

Thereafter, in the region exposed by the second opening OP2 of the second photoresist mask 183, The first and second mask layers 171L and 173L may be patterned using the spacer patterns 175, the first material layers 177, and the second material layers 179 as an etching mask. Accordingly, as illustrated in FIGS. 8A and 8B, a plurality of first mask patterns 171 and second mask patterns 173 spaced apart from each other in the first direction X may be formed. The first and second mask patterns 171A and 173A have a first width W1 in the cell array region CAR, and the first and second mask patterns 171B and 173B may have a second width W2 greater than the first width W1 in the extension area EXT. The spacer patterns 175, the first material layers 177, and the second material layers 179 may be referred to as a 'spacer structure (ST').

Thereafter, subsequent processes including the processes of FIGS. 9A and 9B may be performed. Accordingly, the semiconductor device 100 illustrated in FIGS. 1 to 3 may be manufactured.

As set forth above, according to example embodiments, a method of manufacturing a semiconductor device, including a method of patterning a bit line structure having a different width for respective regions, may be provided. Accordingly, the bit line structure may be reliably formed without defects.

While aspects of example embodiments have been illustrated and described above, it will be apparent to those skilled in the art that modifications and variations could be made without departing from the scope of the present inventive concept as defined by the appended claims.

What is claimed is:

1. A method of manufacturing a semiconductor device, comprising:
    forming a lower structure comprising a cell array region and an extension region, the cell array region comprising a first impurity region, a second impurity region and word lines extending in a first direction, and the extension region comprising an insulating layer;
    forming a preliminary bit line structure on the lower structure;
    forming a mask layer on the preliminary bit line structure and the lower structure;
    forming spacer patterns extending in a second direction, intersecting the first direction, on the mask layer;
    forming material layers on side surfaces of the spacer patterns, on the extension region;
    forming mask patterns by patterning the mask layer using the spacer patterns and the material layers as a first etching mask; and
    forming bit line structures by patterning the preliminary bit line structure using the mask patterns as a second etching mask,
    wherein each of the bit line structures comprises a first portion formed on the cell array region and a second portion formed on the extension region, and
    wherein the first portion is narrower than the second portion.

2. The method of claim 1, wherein each of the mask patterns comprises a first pattern on the cell array region and a second pattern on the extension region, and
    wherein the first pattern is narrower than the second pattern.

3. The method of claim 2, wherein a side surface of the first pattern is offset from a side surface of the second pattern.

4. The method of claim 1, further comprising:
    removing the spacer patterns and the material layers used as the first etching mask; and removing the mask patterns used as the second etching mask.

5. The method of claim 1, wherein a side surface of the first portion is offset from a side surface of the second portion.

6. The method of claim 1, wherein the forming the preliminary bit line structure on the lower structure comprises:

forming a conductive layer on the lower structure; and forming a capping layer on the conductive layer.

7. The method of claim 6, wherein the forming the conductive layer on the lower structure comprises:

forming a bit line contact hole exposing the first impurity region in the cell array region of the lower structure;

forming a first conductive material layer in the bit line contact hole; and forming a second conductive material layer on the first conductive material layer.

8. The method of claim 1, wherein the forming the spacer patterns comprises:

forming sacrificial patterns on the mask layer;

forming spacer layers on side surfaces of the sacrificial patterns; and removing the sacrificial patterns.

9. The method of claim 1, wherein each of the spacer patterns comprises:

line portions extending parallel to each other; and edge portions connecting the line portions adjacent to each other.

10. The method of claim 1, wherein the forming the material layers on the spacer patterns comprises forming the material layers using atomic layer deposition (ALD).

11. The method of claim 1, wherein a thickness of each of the material layers is in a range from about 10 Å to about 20 Å.

12. The method of claim 1, further comprising:

forming insulating patterns between the bit line structures adjacent to each other, on the word lines;

forming a hole exposing the second impurity region;

forming a conductive pattern in the hole; and forming a data storage structure electrically connected to the conductive pattern.

13. The method of claim 1, wherein the forming the material layers comprises:

forming a photoresist mask defining an opening that exposes the extension region, on the lower structure; and depositing the material layers on the side surfaces of the spacer patterns on the extension region, using the photoresist mask as an anti-deposition layer.

14. A method of manufacturing a semiconductor device, comprising:

forming a lower structure comprising a cell array region and an extension region;

forming a preliminary bit line structure on the lower structure;

forming a spacer structure that extends in an extension direction from the cell array region to the extension region, on the preliminary bit line structure, the spacer structure having a symmetrical shape with respect to the extension direction, and the spacer structure being narrower in the cell array region than in the extension region; and forming a bit line structure by patterning the preliminary bit line structure using the spacer structure as an etching mask.

15. The method of claim 14, wherein the bit line structure comprises a first portion formed in the cell array region and a second portion formed in the extension region, and wherein the first portion is narrower than the second portion.

16. The method of claim 15, wherein the first portion of the bit line structure has a first side, wherein the second portion of the bit line structure has a second side, and wherein the first side is offset from the second side.

17. The method of claim 14, wherein the lower structure comprises an insulating layer disposed below the preliminary bit line structure, in the extension region.

18. The method of claim 14, wherein the spacer structure comprises:

a spacer pattern extending in the extension direction from the cell array region to the extension region and having a predetermined width; and material layers on side surfaces of the spacer pattern, in the cell array region and the extension region.

19. The method of claim 18, wherein the material layers comprise:

a first spacer layer on the side surfaces of the spacer pattern, in the cell array region and the extension region, and a second spacer layer on the first spacer layer, in the extension region.

20. A method of manufacturing a semiconductor device, comprising:

forming a lower structure comprising a cell array region and an extension region;

forming a preliminary bit line structure on the lower structure;

forming spacer patterns extending in a direction from the cell array region to the extension region, on the preliminary bit line structure;

sequentially forming a first spacer layer and a second spacer layer on side surfaces of the spacer patterns, in the cell array region and the extension region;

selectively removing the second spacer layer in the cell array region;

forming bit line structures by patterning the preliminary bit line structure using the spacer patterns, the first spacer layer, and the second spacer layer as an etching mask; and removing the spacer patterns, the first spacer layer, and the second spacer layer, wherein each of the bit line structures comprises a first portion in the cell array region and a second portion in the extension region, the first portion being narrower than the second portion.

* * * * *